US011791132B2

(12) United States Patent
Mangnus et al.

(10) Patent No.: US 11,791,132 B2
(45) Date of Patent: Oct. 17, 2023

(54) APERTURE ARRAY WITH INTEGRATED CURRENT MEASUREMENT

(71) Applicant: ASML Netherlands B.V., Veldhoven (NL)

(72) Inventors: Albertus Victor Gerardus Mangnus, Eindhoven (NL); Maikel Robert Goosen, Eindhoven (NL); Erwin Paul Smakman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/830,204

(22) Filed: Mar. 25, 2020

(65) Prior Publication Data

US 2020/0312619 A1 Oct. 1, 2020

(30) Foreign Application Priority Data

Mar. 28, 2019 (EP) .................................... 19166009

(51) Int. Cl.
*H01J 37/317* (2006.01)
*H01J 37/24* (2006.01)
(Continued)

(52) U.S. Cl.
CPC ........ *H01J 37/3177* (2013.01); *H01J 37/243* (2013.01); *H01J 37/244* (2013.01); *H01J 37/3045* (2013.01); *H01J 2237/0435* (2013.01)

(58) Field of Classification Search
CPC .... H01J 37/3177; H01J 37/243; H01J 37/244; H01J 37/3045; H01J 2237/0435
See application file for complete search history.

(56) References Cited

U.S. PATENT DOCUMENTS 9,082,588 B2 * 7/2015 Matsumoto ............... G03F 7/20
9,607,806 B2 * 3/2017 Zonnevylle ............ B82Y 10/00
(Continued)

FOREIGN PATENT DOCUMENTS

JP 2006079911 A 3/2006
JP 2006186125 A 7/2006
(Continued)

OTHER PUBLICATIONS

Office Action of the Intellectual Property Office of Taiwan issued in related Taiwanese Patent Application No. 109110145; dated Feb. 25, 2021 (13 pgs.).

(Continued)

*Primary Examiner* — Sean M Luck
(74) *Attorney, Agent, or Firm* — FINNEGAN, HENDERSON, FARABOW, GARRETT & DUNNER, LLP

(57) ABSTRACT

Systems and methods of measuring beam current in a multi-beam apparatus are disclosed. The multi-beam apparatus may include a charged-particle source configured to generate a primary charged-particle beam, and an aperture array. The aperture array may comprise a plurality of apertures configured to form a plurality of beamlets from the primary charged-particle beam, and a detector including circuitry to detect a current of at least a portion of the primary charged-particle beam irradiating the aperture array. The method of measuring beam current may include irradiating the primary charged-particle beam on the aperture array and detecting an electric current of at least a portion of the primary charged-particle beam.

18 Claims, 9 Drawing Sheets

(51) Int. Cl.
*H01J 37/244* (2006.01)
*H01J 37/304* (2006.01)

(56) References Cited

U.S. PATENT DOCUMENTS

| | | | |
|---|---|---|---|
| 2004/0135102 A1 | 7/2004 | Muraki et al. | |
| 2005/0029473 A1* | 2/2005 | Muraki | B82Y 40/00 |
| | | | 250/492.1 |
| 2005/0072941 A1* | 4/2005 | Tanimoto | H01J 37/317 |
| | | | 250/492.22 |
| 2006/0060775 A1* | 3/2006 | Sakakibara | B82Y 10/00 |
| | | | 250/307 |
| 2006/0138359 A1 | 6/2006 | Maeda | |
| 2007/0057204 A1* | 3/2007 | Kruit | B82Y 10/00 |
| | | | 250/492.23 |
| 2009/0200497 A1* | 8/2009 | Adam | H01J 37/261 |
| | | | 250/252.1 |
| 2012/0091339 A1* | 4/2012 | Ominami | H01J 37/28 |
| | | | 250/311 |
| 2012/0292524 A1 | 11/2012 | Wieland et al. | |
| 2018/0040455 A1* | 2/2018 | Yamashita | H01J 37/28 |

FOREIGN PATENT DOCUMENTS

| | | |
|---|---|---|
| KR | 10-2013-0126936 A | 11/2013 |
| TW | 201236045 A | 9/2012 |
| TW | 201820027 A | 6/2018 |
| TW | 201823877 A | 7/2018 |

OTHER PUBLICATIONS

International Search Report and Written Opinion issued in related PCT International Application No. PCT/EP2020/056432, dated Jun. 9, 2020 (13 pgs.).

European Search Report Issued in related European Application No. EP 19 16 6009, dated Apr. 11, 2019 (2 pgs.).

Notice of Reasons for Rejection issued by the Japan Patent Office in related Japanese Patent Application No. 2021-555021; dated Sep. 30, 2022 (7 pgs.).

Office Action of the Intellectual Property Office of Taiwan issued in related Taiwanese Patent Application No. 109110145; dated Jun. 21, 2023 (15 pgs.).

Notification of Reason(s) for Refusal issued by Korean Intellectual Property Office in related Korean Patent Application No. 10-2021-7031074; dated Jun. 30, 2023 (12 pgs.).

* cited by examiner

APERTURE ARRAY WITH INTEGRATED CURRENT MEASUREMENT

CROSS-REFERENCE TO RELATED APPLICATIONS

This application claims priority of EP application 19166009.1 which was filed on Mar. 28, 2019, and which is incorporated herein in its entirety by reference.

TECHNICAL FIELD

The embodiments provided herein disclose a multi-beam apparatus, and more particularly a multi-beam electron microscope including an aperture array with integrated beam-current measurement capabilities.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important. Although brighter electron sources may be used to increase the throughput and resolution; however, the stability of the electron source may be compromised, rendering the inspection tools inadequate for their desired purpose.

Thus, related art systems face limitations in, for example, determining stability of the electron source at high beam currents. Further improvements in the art are desired.

SUMMARY

Embodiments of the present disclosure may provide systems and methods of measuring beam current in a multi-beam apparatus. In one aspect, the present disclosure is directed to a multi-beam apparatus. The multi-beam apparatus may include a charged-particle source configured to generate a primary charged-particle beam, and an aperture array. The aperture array may comprise a plurality of apertures configured to form a plurality of beamlets from the primary charged-particle beam, and a detector including circuitry to detect a current of at least a portion of the primary charged-particle beam irradiating the aperture array.

The detector may include circuitry to accumulate electric charge of at least the portion of the primary charged-particle beam and to measure the current based on the accumulated electric charge. The circuitry may be configured to monitor the current of at least the portion of the primary charged-particle beam. The current of at least the portion of the primary charged-particle beam may be used to determine a total current of the primary charged-particle beam.

The detector may include circuitry to further detect at least a change in a position or in a size of a portion of the primary charged-particle beam. The detector may comprise a plurality of current detectors configured to detect a change in at least one of a plurality of parameters of the primary charged-particle beam. The plurality of parameters may comprise a beam position, a beam diameter, a beam current, a beam current density, or a uniformity of the beam current density. Each of the plurality of current detectors may be associated with at least one aperture of the aperture array and may be disposed on the aperture array. The current detector may comprise a Faraday cup, a diode, an array of diodes, a scintillator, or a photo-multiplier tube.

In another aspect, the present disclosure is directed to a multi-beam apparatus comprising a charged-particle source configured to generate a primary charged-particle beam. The apparatus may include a first aperture array comprising a first plurality of apertures and configured to form a plurality of beamlets from the primary charged-particle beam, and a second aperture array. The second aperture array may comprise a second plurality of apertures, and a plurality of current detectors, wherein each of the plurality of current detectors is associated with at least an aperture of the second plurality of apertures and include circuitry to detect a current of a corresponding beamlet of the plurality of beamlets irradiating the second aperture array.

The first aperture array may comprise a current-limiting aperture array disposed between the charged-particle source and the second aperture array. Each of the plurality of current detectors may include circuitry to accumulate electric charge of at least a portion of the corresponding beamlet of the plurality of beamlets and to measure the current based on the accumulated electric charge. Each of the plurality of current detectors may include circuitry to monitor the current of the corresponding beamlet and to detect at least one of a change in a position or in a size of the corresponding beamlet. Each of the plurality of current detectors may include circuitry to detect a change in at least one of a plurality of parameters of the corresponding beamlet, the plurality of parameters comprising one of a beamlet position, a beamlet diameter, a beamlet current, a beamlet current density, or a uniformity of the beamlet current density. Each of the plurality of current detectors may be a Faraday cup, a diode, an array of diodes, a scintillator, or a photo-multiplier tube.

In yet another aspect, the present disclosure is directed to a multi-beam apparatus including a charged-particle source configured to generate a primary charged-particle beam, a first aperture array including a first plurality of apertures configured to form a plurality of beamlets from the primary charged-particle beam, and a first current detector including circuitry to detect a current of at least a portion of the primary charged-particle beam irradiating the first aperture array. The multi-beam apparatus may include a second aperture array comprising a second plurality of apertures, wherein each of the second plurality of apertures is configured to receive at least a portion of a corresponding beamlet of the plurality of beamlets.

The first current detector may include circuitry to accumulate electric charge of at least a portion of the primary charged-particle beam and measure the current based on the accumulated electric charge. The second aperture array may comprise a second current detector associated with at least one of the second plurality of apertures.

In yet another aspect, the present disclosure is directed to a method of measuring beam current in a multi-beam apparatus. The method may include irradiating a primary charged-particle beam on an aperture array and detecting an electric current of at least a portion of the primary charged-particle beam. The method may comprise adjusting, using a control circuit, at least one beam parameter of a plurality of beam parameters based on the detected electric current. The method may further comprise accumulating electric charge of at least the portion of the primary charged-particle beam and measuring the beam current based on the accumulated electric charge.

The method may further comprise monitoring the beam current of at least the portion of the primary charged-particle beam, detecting change in at least one of a plurality of parameters of the portion of the primary charged-particle beam. The plurality of parameters comprises at least one of a beam position, a beam diameter, a beam current, a beam current density, or a uniformity of the beam current density. The method may further comprise determining a total current of the primary charged-particle beam based on the measured current of at least the portion of the primary charged-particle beam. The detector may comprise a plurality of current detectors, and each of the plurality of current detectors is associated with at least one aperture of the aperture array.

In yet another aspect, the present disclosure is directed to a non-transitory computer readable medium storing a set of instructions that is executable by one or more processors of a multi-beam apparatus to cause the multi-beam apparatus to perform a method to measure beam current in the multi-beam apparatus. The method may comprise controlling the irradiating of a primary charged-particle beam on an aperture array and determining the current of the primary charged-particle beam based on detected electric current of at least a portion of the primary charged-particle beam detected by a detector.

The set of instructions that is executable by one or more processors of a multi-beam apparatus may cause the multi-beam apparatus to activate the detector to accumulate electric charge of at least the portion of the primary charged-particle beam and measuring the current of at least the portion of the primary charged-particle beam based on the accumulated electric charge.

DETAILED DESCRIPTION

Figure 1:
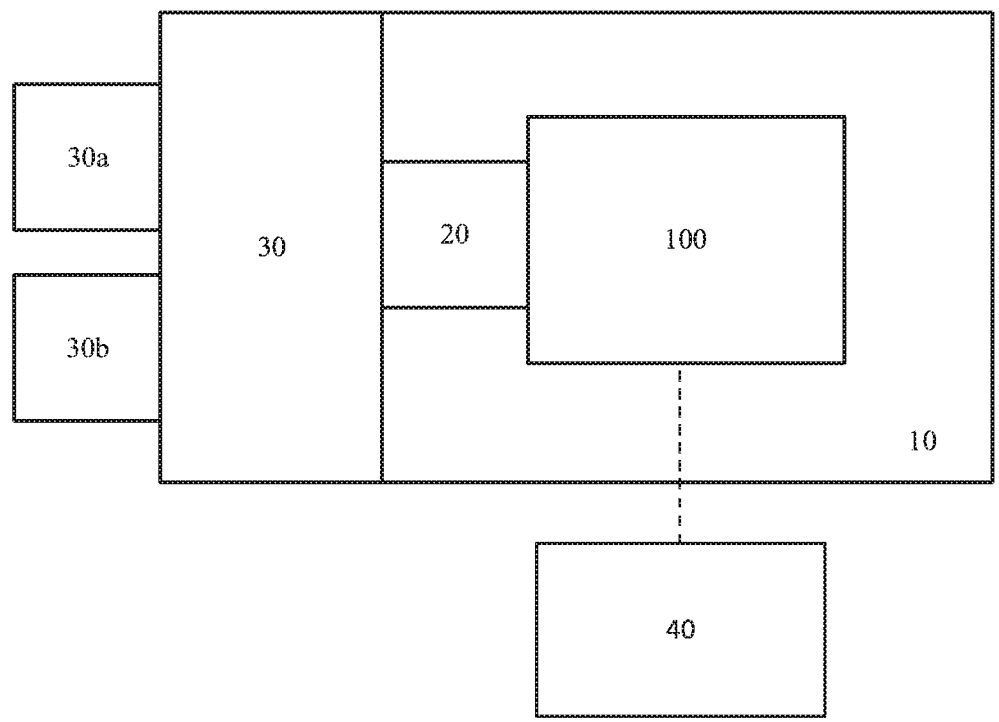
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than $\frac{1}{1000}$th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

As the geometries shrink and the IC chip industry migrates to three-dimensional (3D) architectures (such as, NAND gates, Fin field-effect transistors (FinFETs), and advanced dynamic random-access memory (DRAM), finding defects is becoming more challenging and expensive at each lower node. While high process yield is desirable in an IC chip manufacturing facility, it is also essential to maintain a high wafer throughput, defined as the number of wafers processed per hour. High process yields, and high wafer throughput can be impacted by the presence of defects, especially when operator intervention is involved. Thus, detection and identification of micro and nano-sized defects by inspection tools (such as a SEM) may be essential for maintaining high yields, high throughput, and low cost.

Semiconductor chips are fabricated in an extremely clean and controlled environment that has a very low level of pollutants such as dust, airborne particles, aerosol particles, and chemical vapors. More specifically, a semiconductor cleanroom is required to have a controlled level of contamination that is specified by the number of particles per cubic foot at a specified particle size. A typical chip manufacturing cleanroom contains 1-10 particles per cubic foot of air, each particle being less than 5 µm in diameter. For comparison, the ambient air outside in a typical city environment contains approximately 1.25 billion particles per cubic foot, each particle having an average size of ~200 µm in diameter. A speck of dust as small as 1 µm, on a wafer in process may span across thousands of transistors located on the chip, which could potentially render the entire chip useless. In some cases, a speck of dust on a reticle or a photomask that is used to create repeating patterns on the wafer may cause recurring physical or electrical defects. For example, one or more metal wires connecting transistors in a single chip may overlap or may be undesirably connected through the dust particle, causing a short in the circuit throughout the entire chip.

It is increasingly important to ensure the ability to observe, inspect, and image wafers with high accuracy and high resolution while maintaining high throughput (defined as the number of wafer processes per hour, for example). To increase throughput, some inspection tools may use multiple beams for forming multiple probe spots on the sample surface simultaneously. As one example, an inspection tool may generate a primary beam that is split into multiple beams (e.g., "beamlets") that may then each be scanned over the sample surface, as in a multi-beam inspection system or a multiple charged-particle beam apparatus.

In order to enhance resolution while maintaining the high throughput in a multiple charged-particle beam apparatus, such as a multi-beam SEM, it is desirable that the primary beam have a high current density or high brightness so that the multiple beamlets have as many electrons as possible. The current density of a primary beam (e.g., an electron beam) may be defined as the number of electrons (or charge) per unit area of the beam per unit time. Although, current density may be an important beam parameter, in the context of electron microscopy, beam brightness may be more relevant because electrons exit an electron source with a range of divergent angles and the angular distribution of electrons within a beam may be an important beam parameter. Therefore, beam brightness may be defined as the current density per unit solid angle (expressed in steradians) of the primary source.

A high brightness electron beam may be generated, for example, by increasing the voltage between an anode and a cathode—typically the source of electrons. However, subjecting the primary electron source to high voltages for extended time periods may affect the durability and stability of the electron source. Instability of the primary electron source may affect not only the performance of the source but also the generated primary electron beam. For example, the primary electron beam may exhibit variation of emission current with time, variation of the position of the primary beam with respect to other components of the inspection system, variation in the size of the beam, variation in the total current of the beam, variation of the uniformity of the current density of the beam, etc., potentially reducing the overall efficiency and throughput of the inspection system.

In multi-beam SEM systems, a primary electron beam is split into multiple beamlets, and each of the multiple beamlets may produce a probe spot on the sample surface. The interaction of electrons of the beamlet with the sample generates a signal containing information associated with the probe spot on the sample. The generated signals are subsequently processed to create an image representing the probed sample area, thus enabling a user to visually analyze the sample and any defects thereon. An unstable primary electron beam from an unstable electron source can cause non-uniformity in the generated beamlet currents, resultantly impacting the image quality. In an IC chip manufacturing facility, visual inspection tools such as a multi-beam SEM, are often relied upon for wafer inspection and defect analysis. Therefore, any compromise in the image quality may hinder the user's ability to analyze and inspect the wafers, and potentially affect the overall throughput.

Because image quality can be affected by a number of factors including, but not limited to, unstable primary electron beam, unstable primary electron source, miscalibrated detection system, misaligned optics in the SEM column, sample contamination, mechanical vibrations, thermal and acoustic interferences, etc., determining the cause of degradation in image quality during wafer inspection is very challenging. Any or all of these sources of imaging defects can potentially impact the overall resolution and throughput of the inspection system. Some aspects of the present disclosure propose measuring the beam current (or the beamlet current) at the aperture array, thereby detecting and monitoring instabilities of the primary electron source or the primary electron beam, while the primary electron beam is scanned for wafer inspection. The measurement information may be further utilized to determine the source of the instability and adjust the primary electron source, the primary electron beam, or relevant components of the inspection system, accordingly.

In one aspect of the present disclosure, a multi-beam apparatus including a beam current detector may be used to measure the current of the primary beam or beamlet. The beam current detector may be disposed on an aperture array irradiated by the primary electron beam or the beamlet. The beam current detector may include circuitry to measure the current of the primary electron beam by accumulating electric charge of at least a portion of the primary electron beam and measuring the current of the portion of the primary electron beam.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 1 includes a main chamber 10, a load/lock chamber 20, an electron beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load/lock chamber 20.

Load/lock chamber 20 is connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 100. Main chamber 100 is connected to a main chamber vacuum pump system (not shown), which removes gas molecules in main chamber 100 to reach a second pressure below the first pressure. After reaching the second pressure, the wafer is subject to inspection by electron beam tool 100.

A controller 40 is electronically connected to electron beam tool 100 and may be electronically connected to other components as well. Controller 40 may be a computer configured to execute various controls of EBI system 1. While controller 40 is shown in FIG. 1 as being outside of the structure that includes main chamber 10, load/lock chamber 20, and EFEM 30, it is appreciated that controller 40 can be part of the structure.

While the present disclosure provides examples of main chamber 100 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
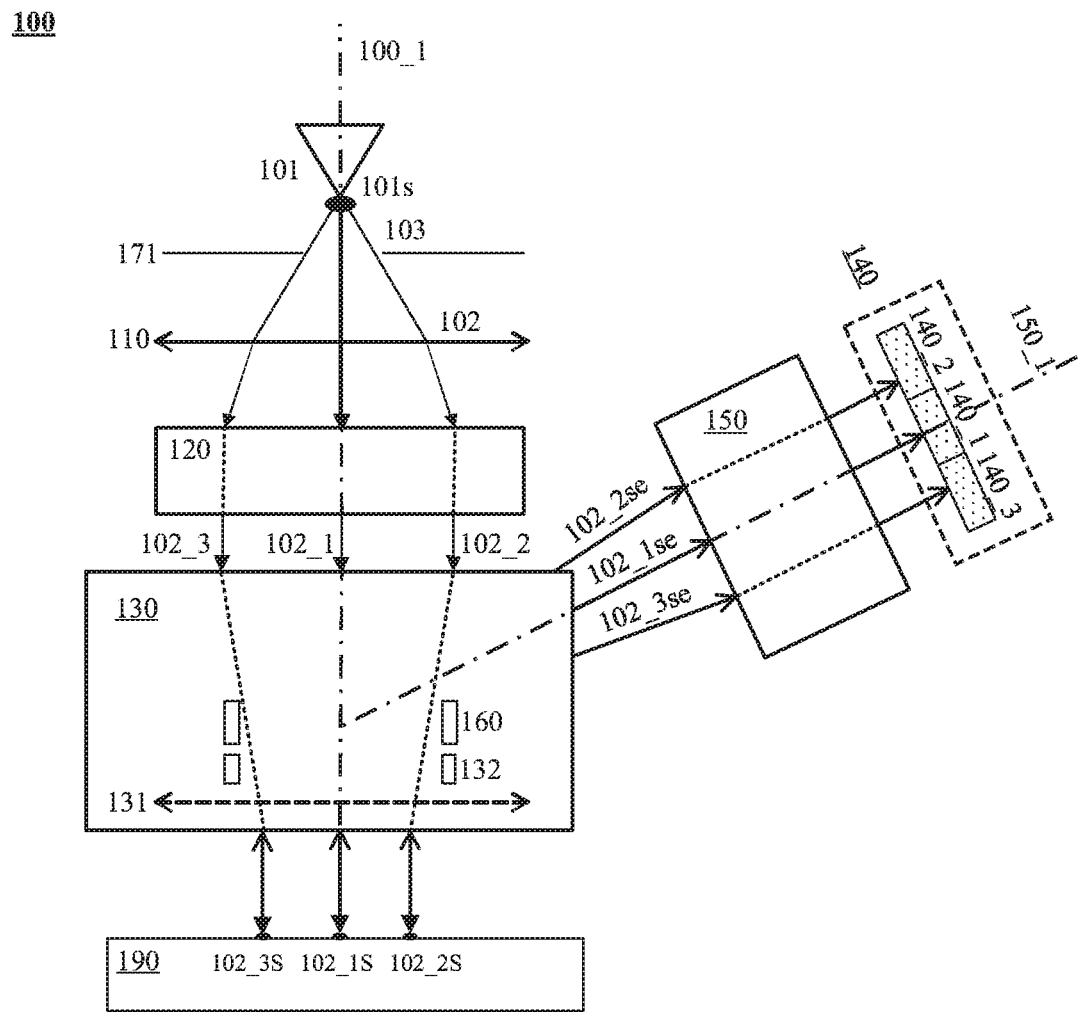
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool that can be a part of the exemplary charged particle beam inspection system of FIG. 1, consistent with embodiments of the present disclosure. An electron beam tool 100 (also referred to herein as apparatus 100) comprises an electron source 101, a gun aperture plate 171 with a gun aperture 103, a condenser lens 110, a source conversion unit 120, a primary projection optical system 130, a sample stage (not shown in FIG. 2), a secondary optical system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 100 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary optical system 150 and electron detection device 140 can be aligned with a secondary optical axis 150_1 of apparatus 100.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 can comprise an image-forming element array (not shown in FIG. 2). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 as an example, and it is appreciated that the source conversion unit 120 can handle any number of beamlets.

Condenser lens 110 can focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. Objective lens 131 can focus beamlets 102_1, 102_2, and 102_3 onto a sample 190 for inspection and can form three probe spots 102_1s, 102_2s, and 102_3s on surface of sample 190. Gun aperture plate 171 can block off peripheral electrons of primary electron beam 102 not in use to reduce Coulomb interaction effects. Coulomb interaction effects can enlarge the size of each of probe spots 102_1s, 102_2s, and 102_3s, and therefore deteriorate inspection resolution.

Beam separator 160 can be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 190. In response to incidence of beamlets 102_1, 102_2, and 102_3 at probe spots 102_1s, 102_2s, and 102_3s, three secondary electron beams 102_1se, 102_2se, and 102_3se can be emitted from sample 190. Each of secondary electron beams 102_1se, 102_2se, and 102_3se can comprise electrons with a distribution of energies including secondary electrons (energies ≤50 eV) and backscattered electrons (energies between 50 eV and landing energies of beamlets 102_1, 102_2, and 102_3). Beam separator 160 can direct secondary electron beams 102_1se, 102_2se, and 102_3se towards secondary optical system 150. Secondary optical system 150 can focus secondary electron beams 102_1se, 102_2se, and 102_3se onto detection elements 140_1, 140_2, and 140_3 of electron detection device 140. Detection elements 140_1, 140_2, and 140_3 can detect corresponding secondary electron beams 102_1se, 102_2se, and 102_3se and generate corresponding signals used to construct images of the corresponding scanned areas of sample 190.

Figure 3:
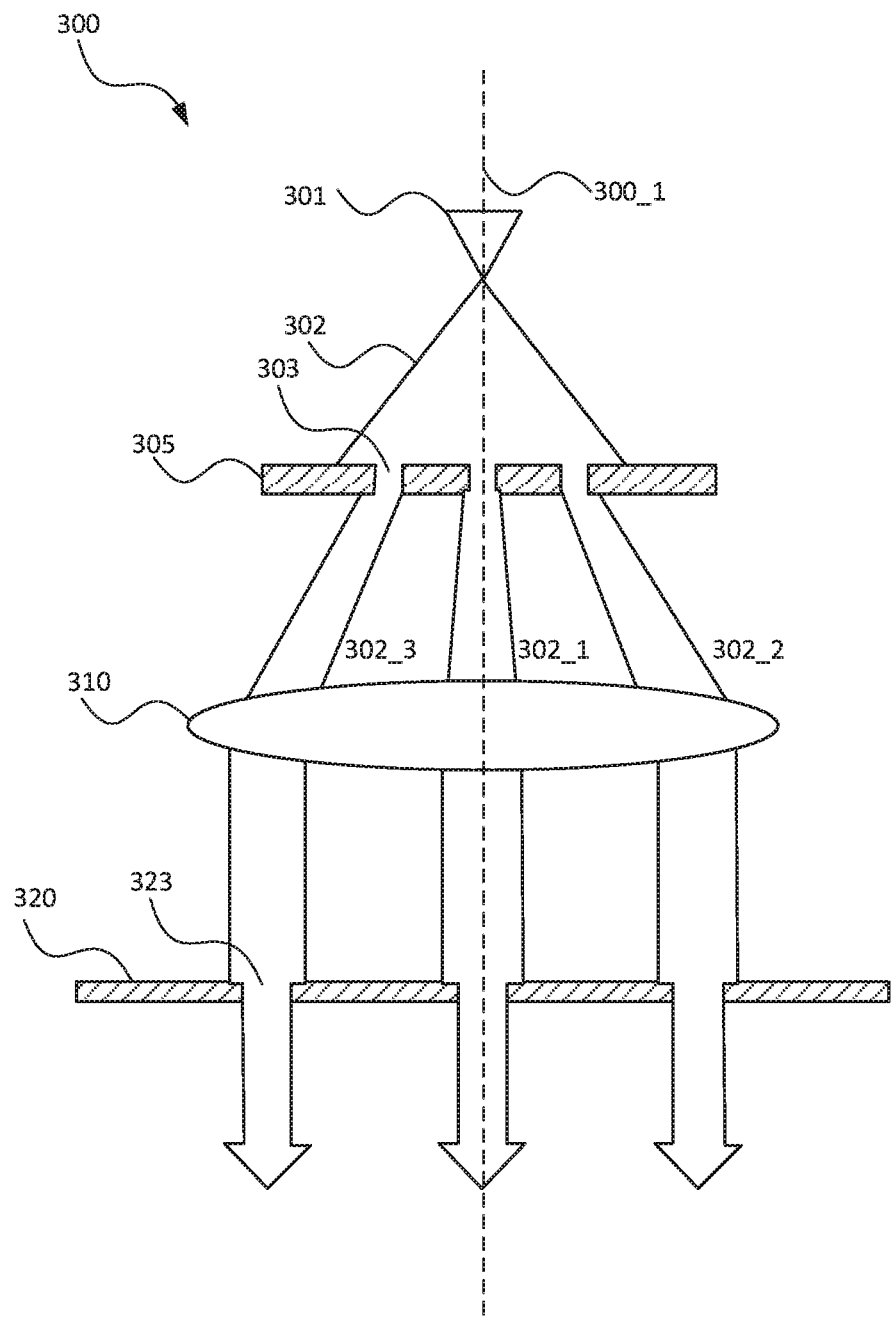
FIG. 3 is a schematic diagram illustrating an exemplary arrangement of aperture arrays in a multi-beam apparatus, consistent with embodiments of the present disclosure.

Reference is now made to FIG. 3, which illustrates an exemplary arrangement of aperture arrays in a multi-beam apparatus 300, consistent with embodiments of the present disclosure. It should be appreciated that multi-beam apparatus 300 may be substantially similar to electron beam tool 100 of FIG. 2. Multi-beam apparatus 300 may include a primary electron source 301, a primary electron beam 302, a current limiting aperture array 305, a condenser lens 310, and a beam limiting aperture array 320. Each of the components of multi-beam apparatus 300 may be aligned with the primary optical axis 300_1.

Primary electron source 301 and primary electron beam 302 of multi-beam apparatus 300 are substantially similar to electron source 101 and primary electron beam 102 of electron beam tool 100 illustrated in FIG. 2. In some embodiments, primary electron source 301 may include, for example, tungsten filaments, Lanthanum hexaboride (LaB$_6$) cathodes, Cerium hexaboride (CeB$_6$), tungsten/Zirconium Oxide (W/ZrO$_2$), etc. An electron source may generate electrons through thermionic emission from a heated source, or through an electric-field induced emission from the cathodes. Other suitable methods of electron emission or electron generation may be employed as well.

Primary electron beam 302 may comprise electrons having high kinetic energies due to the high acceleration electric field to drive the electrons towards the sample (not shown). The kinetic energy of the electrons may be in the range of 0.2-40 keV or higher, determined by the extraction voltage, acceleration voltage, beam-modification lenses, or the like. In some embodiments, primary electron beam 302 may have an optical axis (not illustrated) along which primary electron beam 302 travels towards the sample. The optical axis of primary electron beam 302 may align with primary optical axis 300_1.

Multi-beam apparatus 300 may comprise current limiting aperture array 305 having a plurality of apertures 303 to form a plurality of beamlets. FIG. 3 shows three beamlets 302_1, 302_2, and 302_3 as an example, but it is appreciated that current limiting aperture array 305 may comprise any number of apertures 303 and form any number of beamlets, as appropriate. The cross-section of the apertures 303 of current limiting aperture array 305 may be, for example, circular, rectangular, elliptical, or combinations thereof. Current limiting aperture array 305 may be positioned along the primary optical axis 300_1 between primary electron source 301 and condenser lens 310. Current limiting aperture array 305 may be placed at a fixed predetermined distance away from primary electron source 301.

In some embodiments, current limiting aperture array 305 may comprise a matrix of uniform apertures, for example, each of the apertures 303 of current limiting aperture array 305 may be uniform in cross-section, shape, or size. In some embodiments, current limiting aperture array 305 may comprise a matrix of non-uniform apertures, including apertures of non-uniform cross-section, shape or size. In some embodiments, apertures 303 may be arranged in a linear, circular, rectangular, spiral, zig-zag, serpentine, triangular pattern, or combinations thereof. It is appreciated that apertures of current limiting aperture array 305 may be laid out randomly across the array. Other suitable layouts and configurations of the apertures may be used as well.

In some embodiments, current limiting aperture array 305 may comprise a metal, a ceramic, a plastic, an alloy, a composite, a semiconductor, or any suitable material that is vacuum-compatible and can be processed to form apertures 303. Apertures 303 of current limiting aperture array 305 may be fabricated using photolithography, embossing, ultra-precision laser machining, injection molding, mechanical drilling, micro-electromechanical systems (MEMS) based techniques, etc. or any other suitable technique.

In some embodiments, multi-beam apparatus 300 may include an aperture plate (not shown) such as gun aperture plate 171 of FIG. 2. Aperture plate may be configured to block off peripheral electrons of primary electron beam 102 not in use to reduce Coulomb interaction effects. Coulomb interaction effects can enlarge the size of probe spots on the sample surface, and therefore deteriorate inspection resolution, among other things.

In some embodiments, multi-beam apparatus 300 may include current limiting aperture array 305 and the aperture plate. The aperture plate may be placed between primary electron source 301 and current limiting aperture array 305. The aperture plate may be placed at a predetermined distance from primary electron source 301 such that the plane of the aperture plate is perpendicular to the primary optical axis 300_1. The position of the aperture plate may be a fixed or adjustable based on the beam current requirements.

Current limiting aperture array 305 may be configured to reduce the primary beam current by splitting primary electron beam 302 into beamlets 302_1, 302_2, and 302_3. Each of the beamlets 302_1, 302_2, and 302_3 may have an associated beamlet current lower than the primary beam current of primary electron beam 302. The associated beamlet current, as used herein, is referred to as the electric current determined by the number per time interval of electrons forming the beamlet.

Referring back to FIG. 3, condenser lens 310 of multi-beam apparatus 300 is substantially similar to condenser lens 110 of electron beam tool 100 illustrated in FIG. 2. Condenser lens 310 may be configured to collimate beamlets 302_1, 302_2, and 302_3. Electron beams coming from a source are inherently divergent, and uncollimated electron beams may generate undesirably larger probe spots, resulting in poor resolution of the acquired images. For example, in FIG. 3, one or more beamlets such as 302_1 may be divergent after passing through aperture plate (not shown) or current limiting aperture array 305 and may have to be collimated by condenser lens 310 into multiple relatively parallel beamlets.

Multi-beam apparatus 300 may comprise beam limiting aperture array 320. Beamlets 302_1, 302_2, and 302_3 may be directed to beam limiting aperture array 320 after passing through condenser lens 310. Beam limiting aperture array 320 may comprise a plurality of apertures 323 configured to receive a beamlet and allow at least a portion of the beamlet to pass through. In some embodiments, each of the plurality of apertures 323 may be aligned to receive the collimated beamlets (e.g., beamlet 302_1) from condenser lens 310.

Beam limiting aperture array 320 may comprise a matrix of apertures 323 arranged in a rectangular, circular, triangular, square, serpentine, or a spiral pattern. In some embodiments, apertures 323 may be laid out across beam limiting aperture array 320 randomly. Apertures 323 of beam limiting aperture array 320 may have a uniform cross-section, shape, or size.

Figure 4:
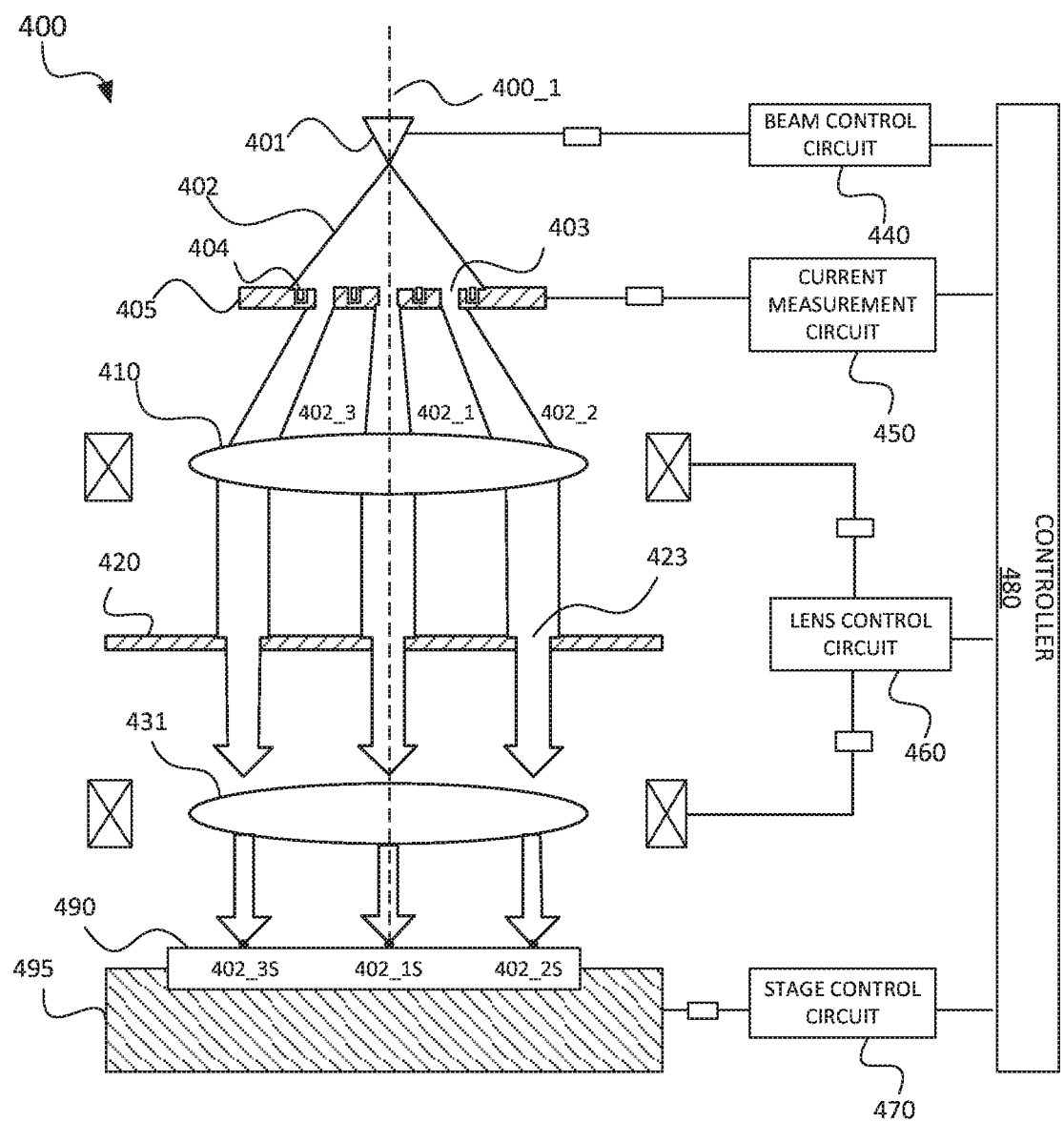
FIG. 4 is a block diagram illustrating an exemplary multi-beam apparatus that can be a part of the exemplary electron beam inspection system of FIG. 1, consistent with embodiments of the present disclosure.

Reference is now made to FIG. 4, which illustrates an exemplary multi-beam apparatus 400 that can be a part of the exemplary electron beam inspection system 100 of FIG. 1, consistent with embodiments of the present disclosure. Multi-beam apparatus 400 may include a primary electron source 401, a primary electron beam 402, a current limiting aperture array 405 having a plurality of apertures 403, a current detector 404, a condenser lens 410, a beam limiting aperture array 420, an objective lens 431, a beam control circuit 440, a current measurement circuit 450, a lens control circuit 460, a stage control circuit 470, a controller 480, and a sample 490 disposed on a stage 495. In some embodiments, one or more of beam control circuit 440, current measurement circuit 450, lens control circuit 460, stage control circuit 470, and controller 480 may be part of controller 40 of FIG. 1. Each of the plurality of apertures 403 is configured to create a beamlet (e.g., 402_1, 402_2, 402_3) and a corresponding probe spot (e.g., 402_1S, 402_2S, 402_3S) on sample 490.

It is appreciated that primary electron source 401, primary electron beam 402, and condenser lens 410, and are similar or substantially similar to primary electron source 301, primary electron beam 302, and condenser lens 310, respectively. Current limiting aperture array 405 may comprise a plurality of apertures 403, substantially similar to apertures 303 or current limiting aperture array 305.

Current limiting aperture array 405 may include a current detector 404 configured to measure current of primary electron beam 402. In some embodiments, current detector 404 may comprise a Faraday cup, a diode, an array of diodes, or a scintillator. It is appreciated that other devices and techniques of current detection may be employed as well.

In some embodiments, multi-beam apparatus 400 may include one current detector 404 disposed on current limiting aperture array 405. Current detector 404 may be placed on current limiting aperture array 405 such that at least a portion of the incident primary electron beam 402 covers the entirety of current detector 404. The charges (e.g., electrons) of a portion of the incident primary electron beam 402 incident on current detector 404 may be accumulated for a predetermined time. The current of the portion of primary electron beam 402 incident on current detector 404 may be measured using current measurement circuit 450 based on the accumulated charges. For example, for a continuous beam of charged particles such as electrons, a measured current of 1 nA ($1 \times 10^9$ Amps) corresponds to ~6.25 billion electrons incident on current detector 404 each second, assuming the charge of an electron to be $1.6\times10^{-19}$ Coulombs.

In some embodiments, current measurement circuit 450 may be electrically connected to current detector 404 and controller 480, configured to control current measurement circuit 450. Current measurement circuit 450 may include a timing control unit, a measurement circuit, a sample-and-hold circuit, an analog-digital converter circuit, and other relevant components used for signal processing and communication with other elements of multi-beam apparatus 400. Controller 480 may comprise a central processing unit including a computer, a server, a microprocessor, a processor, or an integrated circuit. In some embodiments, controller 480 may be a part of or substantially similar to controller 40 of FIG. 1.

The total current or current density of primary electron beam 402 may be determined based on the measured current or current density of the portion of the beam incident on current detector 404. For example, current density of primary electron beam 402 may be determined based on the measured current of the portion of the beam and the area of current detector exposed to primary electron beam 402.

In some embodiments, current detector 404 may be configured to monitor beam current or beam current density over extended periods of time to determine variation in beam parameters including, but not limited to, beam current, beam current density, position of the beam with respect to current limiting aperture array 405, size of the beam, and uniformity of current density. For example, if current detector 404 is placed near the edge of the diameter of primary electron beam 402 incident on current limiting aperture array 405, a small shift in the position of the beam such that current detector 404 is not entirely covered with primary electron beam 402 may result in a decrease in the amount of charge detected, causing the measured current to be smaller.

In a conventional multi-beam SEM such as multi-beam apparatus 400, primary electron beam 402 may comprise a conically divergent beam having a circular cross-section, and current limiting aperture array 405 may include a square array of apertures (e.g., apertures 703 shown in FIG. 7). In such a configuration, it may be desirable to employ more than one current detector 404. For example, placing a current detector (e.g., current detector 404 or 704 of FIG. 7) along each side of the square array of apertures and within the boundaries formed by the periphery of primary electron beam 402 incident on current limiting aperture array 405, may enable detection of beam drift along the X and Y directions. In the context of this disclosure, "drift" of a beam may refer to a finite and continuous variation of a beam parameter over time with respect to an intended initial value for the parameter. For example, drift may refer to a change in the X and Y coordinates of beam position measured with respect to a primary optical axis (e.g., primary optical axis 300_1 of FIG. 3), or a change in the size of the beam cone diameter along a plane perpendicular to the primary optical axis. Upon detection and determination of a drift in the beam parameter based on the information from current measurement circuit 450, controller 480 may facilitate repositioning or reshaping of primary electron beam 402 by adjusting either the source settings through beam control circuit 440, or lens settings through lens control circuit 460, or beam target positioning through stage control circuit 470. It is appreciated that other control mechanisms may be employed as well, as appropriately needed.

Beam control circuit 440 illustrated in FIG. 4 may be configured to control primary electron beam 402. Controlling primary electron beam may include, but is not limited to, controlling extraction voltage, controlling acceleration voltage, controlling beam deflection voltages, etc. In some embodiments, beam control circuit 440 may control primary electron beam 402 based on the feedback from current measurement circuit 450 through controller 480. For example, current measurement circuit 480 may determine a variation in beam current density incident on aperture array 405 and generate a signal. Controller 480 may process the input signal using a signal processing circuit (not shown) and generate an output signal based on the input signal. The output signal may be communicated to beam control circuit 440 to adjust beam current density of primary electron beam 402 based on the signal.

Measurement circuit 450 illustrated in FIG. 4 may be configured to measure current of primary electron beam 402 or beamlets 402_1, 402_2, and 402_3. Measurement circuit 450 may be electrically connected with one or more current detectors 404 disposed on current limiting aperture array 405. In some embodiments, measurement circuit 450 may be electrically connected with current detectors 404 and current detectors disposed on beam limiting aperture array (not illustrated). Measurement circuit 450 may comprise an electrical lead connected with current detector 404 (e.g., a Faraday cup), a current measurement instrument such as an ammeter, or a voltmeter, or an oscilloscope displaying the voltage developed across a resistor from the conducting lead to ground. In some embodiments, measurement circuit 450 may exchange information with controller 480.

In some embodiments, current measurement circuit 450 may comprise a switching device configured to control current detector 404. Switching device may control current detector 404 to collect charges based on a programmed time schedule. For example, switching device may be configured to operate current detector 404 on a 50% duty cycle in detection mode. However, in monitoring mode, current detector 404 may be operated on a 100% duty cycle. Duty cycle may refer to the fraction of a period in which the signal or the system is active. Current detectors such as a Faraday cup may be activated or deactivated by applying a voltage signal to attract or repel electrons.

Lens control circuit 460 illustrated in FIG. 4 may be configured to control condenser lens 410 or objective lens 431. Lens control circuit 460 may exchange information with controller 480. In some embodiments, condenser lens 410 or objective lens 431, or both, may be adjusted based on information from controller 480. For example, lens control circuit 460 may adjust the focal point or the focal strength of condenser lens to ensure the beamlets are collimated. In some embodiments, lens focusing circuit 450 may comprise storage modules such as local memory to store information related with lens adjustments and lens position. Controller 480 may comprise a global memory configured to store information from beam control circuit 440, measurement circuit 450, lens control circuit 460, or stage control circuit 470.

Stage control circuit 470 illustrated in FIG. 4 may be configured to control movement of stage 495 on which sample 490 is securely placed. Stage control circuit 470 may include signal processing units configured to receive stage position information from position sensors and process stage position information to generate signals for moving stage 495 based on the position information received. In some embodiments, position of stage 495 may be adjusted based on the location of probe spots 402_1S, 402_2S, or 402_3S. Stage control circuit 470 may exchange information with controller 480. In some embodiments, position of stage 495 may be adjusted by stage control circuit 470 to compensate for variation in beam parameters.

In some embodiments, primary optical axis 400_1 of multi-beam apparatus may align with the geometric center of current limiting aperture array 405. One or more current detectors 404 may be placed at or close to the geometric center of current limiting aperture array 405 to obtain information related to primary electron source 401. In some embodiments, information obtained from current detector 404 placed at or close to the center of current limiting aperture array 405 may be utilized in combination with information obtained from current detectors 404 placed elsewhere on current limiting aperture array 405 to determine the cause of the drift. For example, a map of electron density within primary electron beam 402 across a plane (e.g., the plane of current limiting aperture array 405 on which primary electron beam 402 is incident and current detectors 404 are disposed) may be generated to determine electron density gradients in the X-Y axes or electron density distribution within the plane, enabling the user to correct the drift while the wafer is inspected.

Beam limiting aperture array 420 may include a plurality of apertures 423 configured to receive beamlets 402_1, 402_2, and 402_3 and limit the number of electrons passing through to objective lens 431 to form corresponding probe spots 402_1S, 402_2S, and 402_3S on sample 490. In some embodiments, beam limiting aperture array 420 may comprise a plurality of current detectors 404 disposed thereon (not shown). Beam limiting aperture array 420 may include a current detector 404 associated with each of the apertures 423. Alternatively, each current detector 404 may be associated with more than one aperture 423. For example, if beam limiting aperture array 420 comprises two apertures 423 separated by a substrate of beam limiting aperture array 420 such that a single beamlet (e.g., beamlet 402_3) entirely irradiates the portion of beam limiting aperture array 420 comprising the two apertures including the substrate separating them, and if current detector 404 is placed within the portion of the substrate separating the apertures 423.

In some embodiments, multi-beam apparatus 400 may include an aperture plate (e.g., gun aperture plate 171 of FIG. 2) and beam limiting aperture array 420, in addition to current limiting aperture array 405. One or more current detectors 404 may be employed on the aperture plate, beam limiting aperture array 420, and current limiting aperture array 405 as well. In such a configuration, beam parameters such as beam position, beam current density, beam current density uniformity, etc. may be monitored at multiple locations along the path of primary electron beam 402 or beamlets 402_1, 402_2, and 402_3 in the SEM column to determine the cause of the drift and allow the user to correct the drift during wafer inspection.

In some embodiments, current detector 404 may include one or more micromachined Faraday cups fabricated using a MEMS-based device fabrication technique. Current detectors such as a Faraday cup may include a conducting cylindrical charge receiver cup coxially enclosed within a grounded outer shell. The gap between the inner cup and the outer shell may be filled with a dielectric or an insulator including, but not limited to, polymers, air, ceramic, etc. Faraday cups may also include a suppressor grid in front to repel stray electrons, and also to retard the backscatter of ions or charges collected in the cup. A coaxial connector such as a metal wire may be electrically connected with the inner cup to form the measurement circuit. Some of the advantages of using a Faraday cup for charge or electron detection may be, but are not limited to, high accuracy, independence from energy and mass of the charge being analyzed, scalability, manufacturability, easy operation, compatible with a wide range of vacuum levels, and easy data analysis.

Figure 5A:
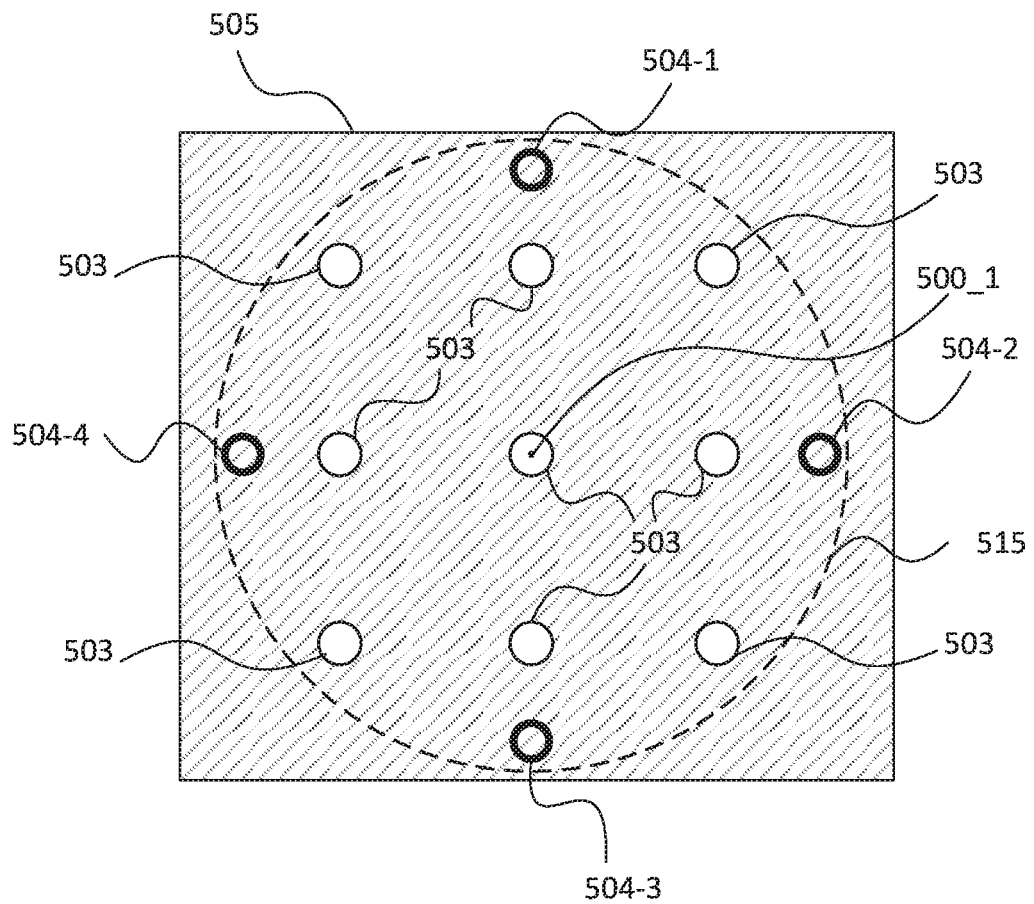
FIGS. 5A-5D are schematic diagrams illustrating exemplary configurations of an aperture array of a multi-beam apparatus, including integrated beam-current detectors, consistent with embodiments of the present disclosure.

Reference is now made to FIG. 5A, which illustrates an exemplary configuration of a current limiting aperture array 505, including a plurality of apertures 503 and current detectors 504, consistent with embodiments of the present disclosure. Although FIG. 5A illustrates four current detectors 504-1, 504-2, 504-3, and 504-4, more or less current detectors may be used. Current limiting aperture array 505 is substantially similar to current limiting aperture array 405 of FIG. 4. As illustrated, FIG. 5A shows a virtual boundary 515 depicting the periphery of the incident primary electron beam 402 on current limiting aperture array 505, encompassing the square array of apertures 503 and one or more current detectors 504 located along the edge of virtual boundary 515, but within the confined area represented by virtual boundary 515. In some embodiments, current detectors 504 may be located anywhere on current limiting aperture array 505 within the confined area represented by virtual boundary 515 such that none of the current detectors block the passage of charged-particles through array of apertures 503.

In some embodiments, a current detector (e.g., 504-1, 504-2, 504-3, or 504-4 of FIG. 5A) may be associated with at least an aperture of current limiting aperture array 505. For example, if current limiting aperture array 505 comprises n number of apertures, the number of current detectors may be n-m, where m is a positive integer and m<n. In some embodiments two or more current detectors may be associated with an aperture of current limiting aperture array 505. For example, if current limiting aperture array 505 comprises n number of apertures, the number of current detectors may be n+m, where m is a positive integer. In some embodiments, each aperture of current limiting aperture array 505 may be associated with a current detector 504. In such a configuration, the number of apertures equals the number of current detectors.

Figure 5B:
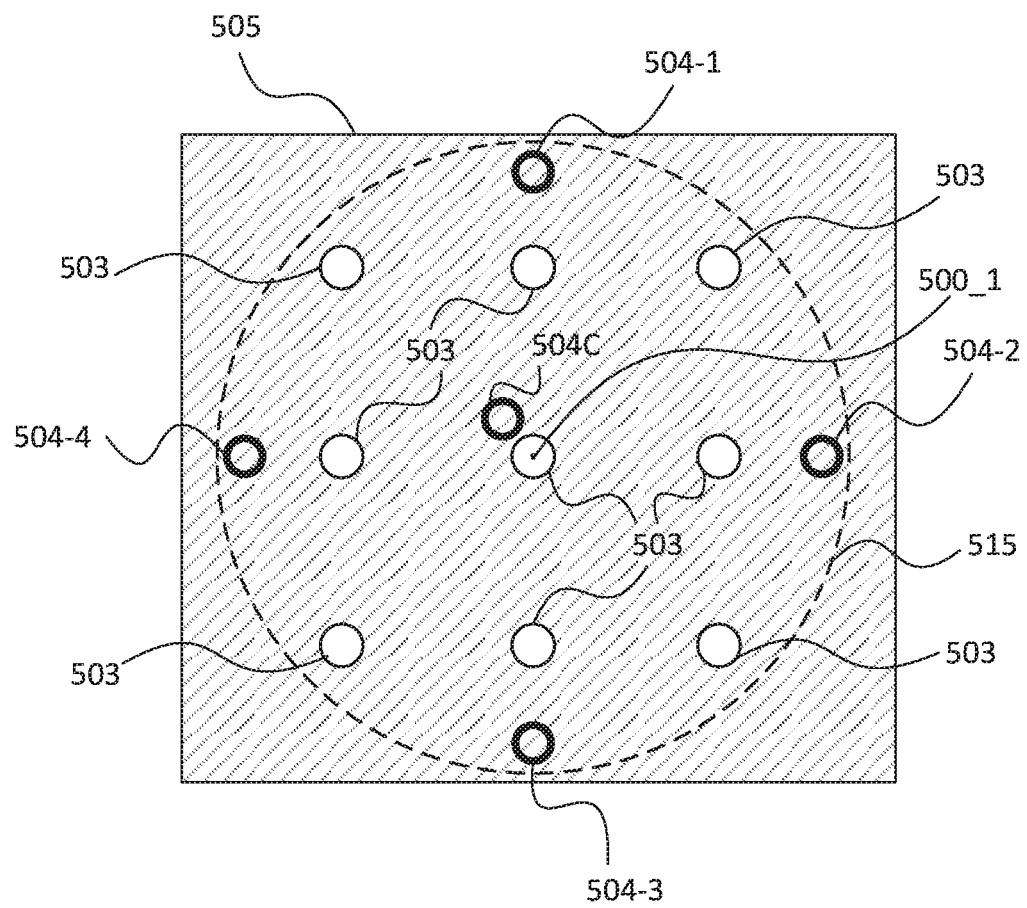

Reference is now made to FIG. 5B, which illustrates an exemplary configuration of current limiting aperture array 505 wherein the geometric center of current limiting aperture array 505 aligns with a primary optical axis 500_1 (similar to primary optical axis 300_1 of FIG. 3 and 400_1 of FIG. 4). In such a configuration, a current detector 504C may be located close to the center aperture 503. In addition, one or more peripheral current detectors 504 may be employed as well.

In some embodiments, each aperture 503 of current limiting aperture array 505 may have an associated current detector 504 disposed adjacent the aperture. In such a configuration, each current detector 504 may generate information related to the incident primary electron beam 402 of FIG. 4. The generated information may be stored in a local memory within current measurement circuit 450 or controller 480 of FIG. 4. The information may be utilized to generate a mapping of electron density within primary electron beam 402, for example, to determine the cause of drift.

Figure 5C:
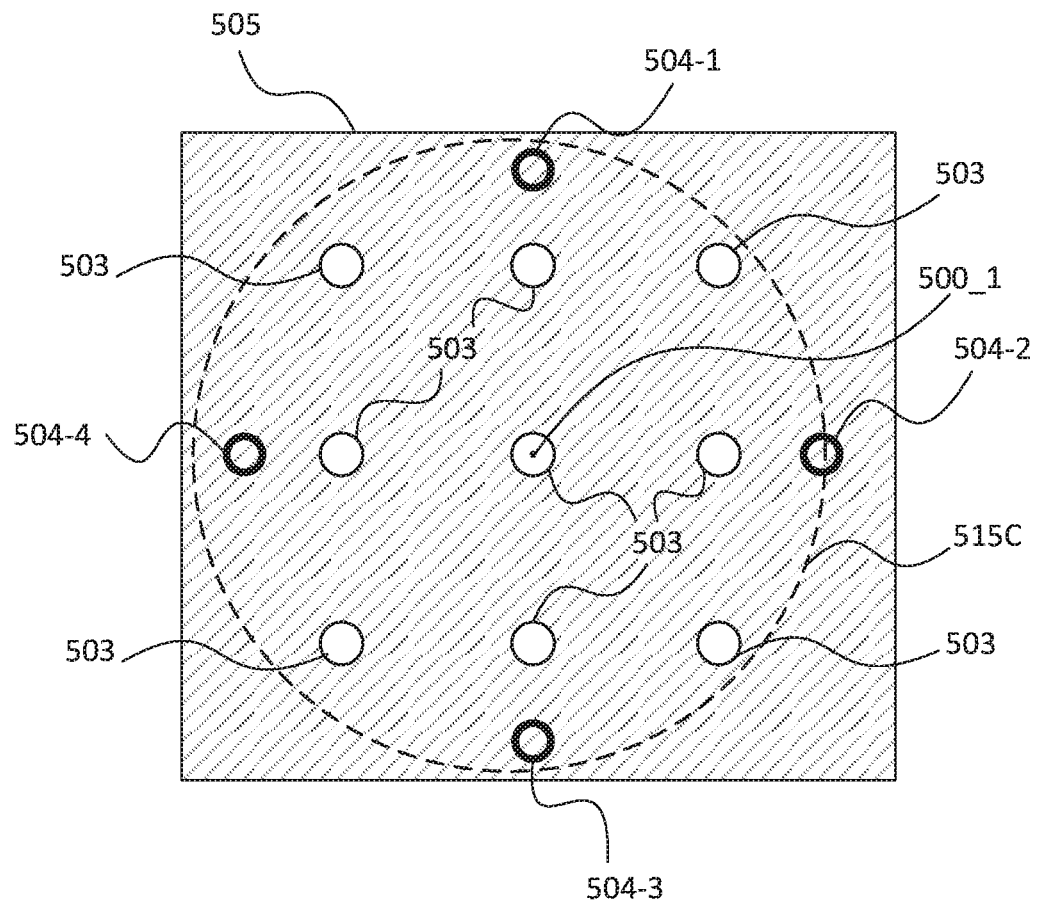

In some embodiments, the total beam current may be determined based on the total beam current collected or the average beam current detected by the current detectors (e.g., 504-1, 504-2, 504-3, and 504-4). As shown in FIG. 5C, which illustrates an exemplary configuration of current limiting aperture array 505, virtual boundary 515C representing the cross-section of primary electron beam 402 incident on current limiting aperture array 505 is shifted along the x-axis such that a portion of current detector 504-2 is not exposed to primary electron beam 402. The amount of beam current collected by the detectors may vary based on the portion of the beam incident on the current detectors, for example, the number of charged-particles collected by current detector 504-2 may be less compared to the number of charged-particles collected by one of current detectors 504-1, 504-3, 504-4. Therefore, the total beam current collected may be less, indicating a drift of primary electron beam 402. In some embodiments, each current detector 504 may be configured to generate information related to the number of charged-particles collected. In such configurations, the amount and direction of beam drift may be determined based on the information received from each current detector.

Figure 5D:
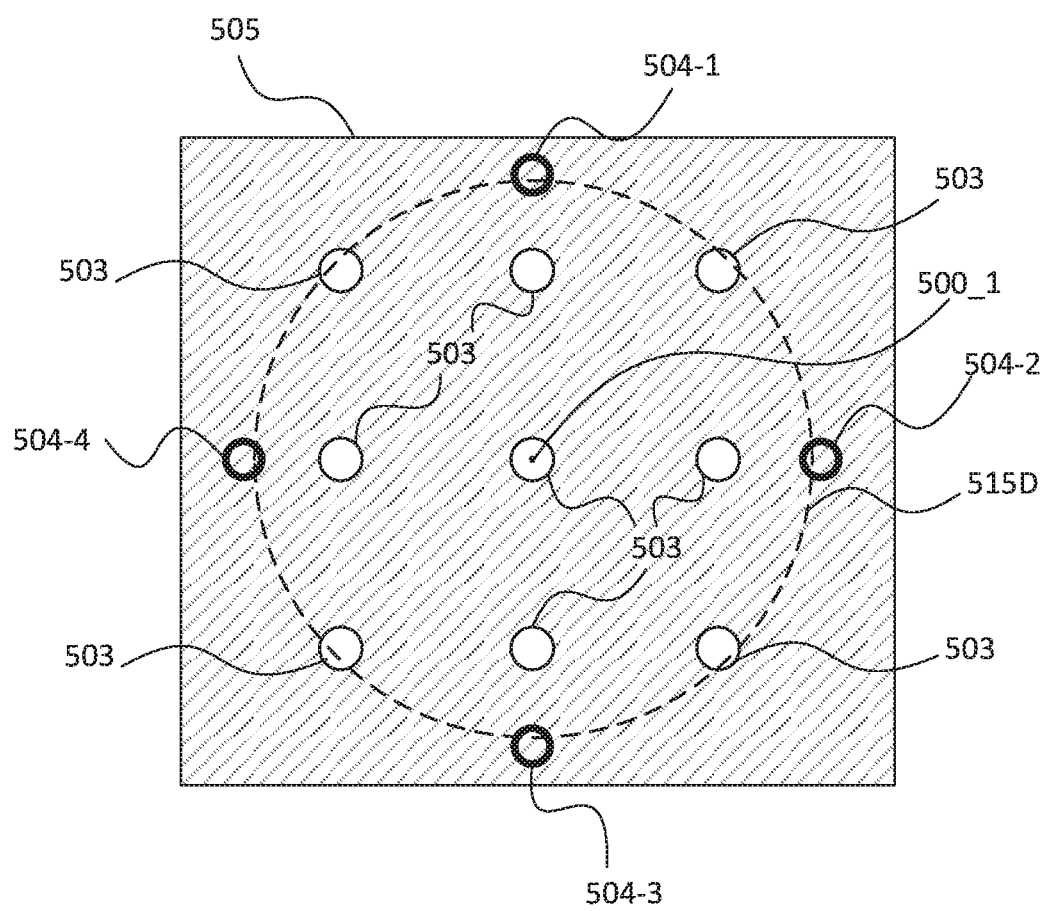

Reference is now made to FIG. 5D, which illustrates an exemplary configuration of current limiting aperture array 505 wherein the diameter of primary electron beam 402 represented by virtual boundary 515D is smaller compared to diameter of primary electron beam 402 represented by virtual boundary 515 shown in FIG. 5A, such that a portion of one or more current detectors 504 is not exposed to the electrons of primary electron beam 402. In some embodiments, as illustrated in FIG. 5D, primary electron beam 402 represented by virtual boundary 515D may not be incident on one or more apertures 503 in their entirety, causing variations in probe spot size and shape. The amount of beam current collected by current detectors 504 may indicate a change in beam size incident on current limiting aperture array 505. Thus, the change in beam size may be determined based on information related to the number of charged particles collected by each current detector 504.

Although not illustrated, it is appreciated that in some embodiments, primary electron beam 402 incident on current limiting aperture array 505 represented by virtual boundary 515D may be large enough to expose all apertures 503 but only a portion of one or more current detectors 504 may be exposed.

Figure 6:
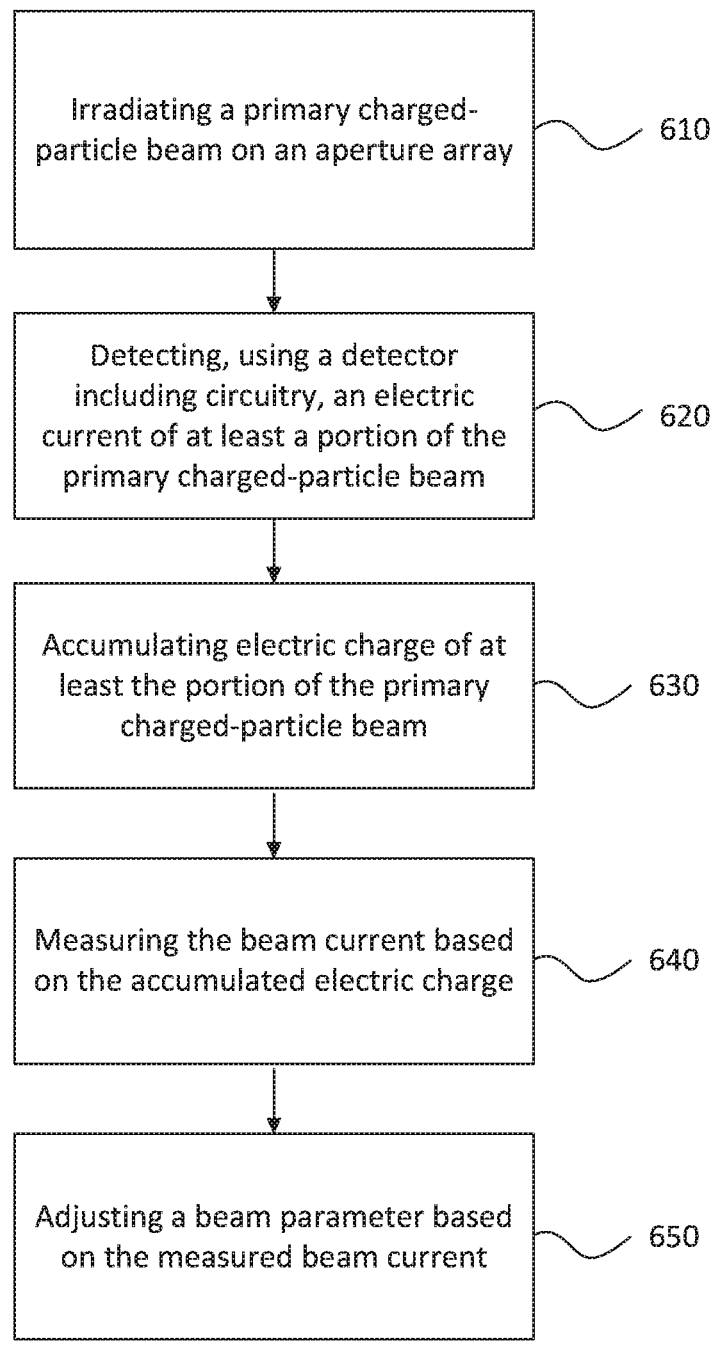
FIG. 6 is a flow chart showing an exemplary method of measuring beam current in a multi-beam apparatus, consistent with embodiments of the present disclosure.

FIG. 6 represents a process flow chart of an exemplary method of measuring beam current in a multi-beam apparatus (e.g., multi-beam apparatus 300 of FIG. 3), consistent with embodiments of the present disclosure. The method of measuring beam current may include generating a primary charged-particle beam such as an electron beam from a primary charged-particle source, irradiating the primary charged-particle beam on an aperture array, and detecting current of the primary charged-particle beam incident on the aperture array.

In step 610, a primary charged-particle beam (e.g., primary electron beam 302 of FIG. 3) may be irradiated on an aperture array (e.g., current limiting aperture array 305 of FIG. 3). The primary charged-particle beam may be generated from a primary charged-particle source (e.g., primary electron source 301 of FIG. 3). In some embodiments, the multi-beam apparatus may include a gun aperture plate disposed between the primary charged-particle source and the current limiting aperture array. The gun aperture plate may be configured to adjust the beam current or beam current density by blocking off peripheral electrons of the primary electron beam, thereby producing an electron beam with a higher uniformity in current density.

The current limiting aperture array may comprise a plurality of apertures (e.g., aperture 303 of FIG. 3) configured to generate a plurality of beamlets (e.g., beamlets 302_1, 302_2, and 302_3). The current limiting aperture array may be configured to block off peripheral electrons and off-axial beam electrons of the primary electron beam to reduce Coulomb interaction effects. The Coulomb interaction effects can enlarge the size of each of probe spots, and therefore deteriorate inspection resolution.

In some embodiments, the current limiting aperture array may comprise a matrix of apertures. Each aperture in the matrix may be uniform in size, shape, or cross-section. The apertures may be arranged in a rectangular, or a square, or a circular matrix. Other layouts of apertures are possible as well.

In step 620, a detector including circuitry (e.g., current detector 404 of FIG. 4) may be configured to detect current of at least a portion of the primary electron beam. The total current of the primary electron beam may be determined based on the detected current of the portion of the beam incident on the detector. In some embodiments, the detector may comprise one current detector disposed on the current limiting aperture array. Information related with beam current or beam current density may be obtained based on the current detected by one current detector.

In some embodiments, as illustrated in FIGS. 5A-5D, the detector may comprise a plurality of current detectors (e.g., current detectors 504 of FIG. 5A) disposed on the current limiting aperture array. For example, one or more current detectors 504 may be located along the edge of virtual boundary 515, but within the confined area represented by virtual boundary 515. In some embodiments, current detectors 504 may be located anywhere on current limiting aperture array 505 within the confined area represented by virtual boundary 515 such that none of the current detectors block the passage of charged-particles through array of apertures 503. In such a configuration, the beam position and the beam cone diameter may also be determined, in addition to the beam current or beam current density. In some embodiments, a current detector may be placed adjacent each aperture of the current limiting aperture array. In such a configuration, it may be possible to determine uniformity of beam current density based on the information obtained from each current detector.

The current detector may be electrically connected to a current measurement circuit (e.g., current measurement circuit 450 of FIG. 4). Each of the current detectors may comprise an electrical lead connected to an electrical measurement device such as, but not limited to, an ammeter, a voltmeter, an oscilloscope, etc. The current detector may comprise a Faraday cup, a diode, an array of diodes, or a scintillator. Other means of current detection may be employed as well.

In step 630, the detector may be configured to accumulate electric charge of at least the portion of the primary electron beam incident on the detector. The charges such as electrons of the primary electron beam may be collected in the detector for a predetermined time. The current detector may be controlled by a switching device in the current measurement circuit.

In detection mode, the switching device may activate the current detector to operate on a 50% duty cycle or a 75% duty cycle. However, in monitoring mode, the current detector may operate on a 100% duty cycle. A 100% duty cycle refers to continuous operation of current detector.

In step 640, the beam current or the beamlet current may be measured based on the accumulated electric charge. The current detectors may be exposed to a portion of the primary electron beam and therefore, may only accumulate charges in the portion of the beam incident thereon. The total beam current or current density may be determined based on the measured current of the accumulated charge representing the portion of the electron beam, area of the beam incident upon the current detector, time of exposure and the type of charges of the primary charged-particle beam.

In step 650, after measuring the beam current (e.g., using current measurement circuit 450 of FIG. 4), the parameters of the beam can be adjusted. For example, in reference to FIG. 4, controller 480 may be configured to send a signal to beam control circuit 440 to control primary electron beam 402. Controlling primary electron beam 402 may include adjusting one or more beam parameters based on the measured beam current. The beam parameters may be adjusted by, for example, controlling extraction voltage, controlling acceleration voltage, controlling beam deflection voltages, etc. For example, upon determining that the beam is not large enough to adequately cover all the apertures of current limiting aperture array 505, the beam current of primary electron beam 402 may be increased to enlarge the size and therefore, cover all the apertures with incident primary electron beam 402. In some embodiments, primary electron beam 402 may be adjusted to offset the determined drift based on the measured beam current, for example, by deflecting the primary electron beam such that all the apertures may receive adequate current and be covered by the incident primary beam.

In some embodiments, the current detectors may be configured to monitor a plurality of beam parameters including, but not limited to, beam position, beam diameter, beam current, beam current density, or uniformity of the beam current density. As illustrated in FIGS. 5A-5D, the placement of one or more current detectors on the current limiting aperture array may enable determining the beam position based on the amount of beam current collected by the current detectors. For example, if the beam is shifted in a direction, the total number of electrons and therefore the current collected may vary based on the amount of shift and the direction of the shift, thus allowing the user to determine the beam position, beam current, and beam current density. As illustrated in FIG. 5D, the beam position may be determined based on the amount of charges collected by peripheral current detectors.

The embodiments may further be described using the following clauses:

1. A multi-beam apparatus comprising:
    a charged-particle source configured to generate a primary charged-particle beam; and
    an aperture array comprising:
        a plurality of apertures configured to form a plurality of beamlets from the primary charged-particle beam; and
        a detector including circuitry to detect a current of at least a portion of the primary charged-particle beam irradiating the aperture array.

2. The apparatus of clause 1, wherein the detector includes circuitry to accumulate electric charge of at least the portion of the primary charged-particle beam and to measure the current based on the accumulated electric charge.

3. The apparatus of any one of clauses 1 and 2, wherein the detector includes circuitry to monitor the current of at least the portion of the primary charged-particle beam.

4. The apparatus of clause 3, wherein the detector includes circuitry to detect at least one of a change in a position or in a size of at least the portion of the primary charged-particle beam.

5. The apparatus of any one of clauses 1 to 4, wherein the current of at least the portion of the primary charged-particle beam is used to determine a total current of the primary charged-particle beam.

6. The apparatus of any one of clauses 1 to 5, wherein the detector comprises a plurality of current detectors configured to detect a change in at least one of a plurality of parameters of the primary charged-particle beam.

7. The apparatus of clause 6, wherein the plurality of parameters comprises at least one of a beam position, a beam diameter, a beam current, a beam current density, or a uniformity of the beam current density.

8. The apparatus of any one of clauses 6 and 7, wherein each of the plurality of current detectors is associated with at least one aperture of the aperture array.

9. The apparatus of any one of clauses 6 to 8, wherein each of the plurality of current detectors is disposed on the aperture array.

10. The apparatus of any one of clauses 1 to 9, wherein the detector comprises a Faraday cup, a diode, an array of diodes, or a scintillator.

11. A multi-beam apparatus comprising:
    a charged-particle source configured to generate a primary charged-particle beam;
    a first aperture array comprising a first plurality of apertures and configured to form a plurality of beamlets from the primary charged-particle beam; and
    a second aperture array comprising:
        a second plurality of apertures; and
        a plurality of current detectors, wherein each of the plurality of current detectors is associated with at least an aperture of the second plurality of apertures and includes circuitry to detect a current of a corresponding beamlet of the plurality of beamlets irradiating the second aperture array.

12. The apparatus of clause 11, wherein the first aperture array is disposed between the charged-particle source and the second aperture array.

13. The apparatus of any one of clauses 11 and 12, wherein the first aperture array comprises a current-limiting aperture array.

14. The apparatus of any one of clauses 11 to 13, wherein each of the plurality of current detectors includes circuitry to accumulate electric charge of at least a portion of the corresponding beamlet of the plurality of beamlets and to measure the current based on the accumulated electric charge.

15. The apparatus of any one of clauses 11 to 14, wherein each of the plurality of current detectors includes circuitry to monitor the current of the corresponding beamlet.

16. The apparatus of clause 15, wherein each of the plurality of current detectors includes circuitry to detect at least one of a change in a position or in a size of the corresponding beamlet.

17. The apparatus of any one of clauses 11 to 16, wherein each of the plurality of current detectors includes circuitry to detect a change in at least one of a plurality of parameters of the corresponding beamlet.

18. The apparatus of clause 17, wherein the plurality of parameters comprises at least one of a beamlet position, a beamlet diameter, a beamlet current, a beamlet current density, or a uniformity of the beamlet current density.

19. The apparatus of any one of clauses 11 to 18, wherein the each of the plurality of current detectors comprises a Faraday cup, a diode, an array of diodes, or a scintillator.

20. A multi-beam apparatus comprising:
    a charged-particle source configured to generate a primary charged-particle beam;
    a first aperture array comprising:
        a first plurality of apertures configured to form a plurality of beamlets from the primary charged-particle beam, and a first current detector including circuitry to detect a current of at least a portion of the primary charged-particle beam irradiating the first aperture array; and a second aperture array comprising a second plurality of apertures, wherein each of the second plurality of apertures is configured to receive at least a portion of a corresponding beamlet of the plurality of beamlets.

21. The apparatus of clause 20, wherein the first current detector includes circuitry to accumulate electric charge of at least a portion of the primary charged-particle beam and measure the current based on the accumulated electric charge.

22. The apparatus of any one of clauses 20 and 21, wherein the second aperture array comprises a second current detector associated with at least one of the second plurality of apertures.

23. The apparatus of clause 22, wherein the second current detector includes circuitry to accumulate electric charge of at least the portion of the corresponding beamlet of the plurality of beamlets and to measure the current based on the accumulated electric charge.

24. The apparatus of any one of clauses 20 to 23, wherein the first current detector includes circuitry to detect a change in at least one of a plurality of parameters of the primary charged-particle beam.

25. The apparatus of any one of clauses 22 to 24, wherein the second current detector includes circuitry to detect a change in at least one of a plurality of parameters of the corresponding beamlet.

26. The apparatus of clause 24, wherein the plurality of parameters of the primary charged-particle beam comprises at least one of a beam position, a beam diameter, a beam-current, a beam-current density, or a uniformity of the beam-current density.

27. The apparatus of clause 25, wherein the plurality of parameters of the corresponding beamlet comprises at least one of a beamlet position, a beamlet diameter, a beamlet current, a beamlet current density, or a uniformity of the beamlet current density.

28. The apparatus of any one of clauses 20 to 27, wherein the first current detector comprises a Faraday cup, a diode, an array of diodes, or a scintillator.

29. The apparatus of any one of clauses 22 to 28, wherein the second current detector comprises a Faraday cup, a diode, an array of diodes, a scintillator.

30. The apparatus of any one of clauses 20 to 29, wherein the first aperture array comprises a plurality of current detectors.

31. A method of measuring beam current in a multi-beam apparatus, the method comprising:

irradiating a primary charged-particle beam on an aperture array;

detecting, using a detector positioned on the aperture array, an electric current of at least a portion of the primary charged-particle beam; and adjusting at least one beam parameter of a plurality of beam parameters based on the detected electric current.

32. The method of clause 30, further comprising accumulating electric charge of at least the portion of the primary charged-particle beam and measuring the beam current based on the accumulated electric charge.

33. The method of any one of clauses 30 and 31, further comprising monitoring the beam current of at least the portion of the primary charged-particle beam.

34. The method of any one of clauses 30 to 32, further comprising detecting change in at least one of a plurality of parameters of the portion of the primary charged-particle beam.

35. The method of clause 33, wherein the plurality of parameters comprises at least one of a beam position, a beam diameter, a beam current, a beam current density, or a uniformity of the beam current density.

36. The method of any one of clauses 30 to 34, further comprising determining a total current of the primary charged-particle beam based on the measured current of at least the portion of the primary charged-particle beam.

37. The method of any one of clauses 30 to 35, wherein the detector comprises a plurality of current detectors, and wherein each of the plurality of current detectors is associated with at least one aperture of the aperture array.

38. A non-transitory computer readable medium storing a set of instructions that is executable by one or more processors of a multi-beam apparatus to cause the multi-beam apparatus to perform a method to measure beam current in the multi-beam apparatus, the method comprising:

controlling the irradiating of a primary charged-particle beam on an aperture array; and determining the current of the primary charged-particle beam based electric current of at least a portion of the primary charged-particle beam detected by a detector.

39. The non-transitory computer readable medium of clause 37, wherein the set of instructions that is executable by one or more processors of a multi-beam apparatus cause the multi-beam apparatus to further perform:

activating the detector to accumulate electric charge of at least the portion of the primary charged-particle beam;

measuring the current of at least the portion of the primary charged-particle beam based on the accumulated electric charge; and adjusting at least one beam parameter of a plurality of beam parameters based on the measured electric current.

A non-transitory computer readable medium may be provided that stores instructions for a processor of a controller (e.g., controller 40 of FIG. 1) to carry out image inspection, image acquisition, stage positioning, beam focusing, electric field adjustment, beam bending, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

What is claimed is:

1. A multi-beam apparatus for inspecting a sample, comprising:
    a charged-particle source configured to generate a primary charged-particle beam;
    an aperture array comprising:
        a plurality of apertures configured to form a plurality of beamlets from the primary charged-particle beam; and
        a plurality of detectors disposed on a beam entrance side of the aperture array with respect to the primary charged-particle beam and along an inside edge of a virtual boundary representing a desired size and position of the primary charged-particle beam incident on the aperture array, the plurality of detectors configured to accumulate electric charge of at least a portion of the primary charged-particle beam irradiating the aperture array; and
    a controller having circuitry coupled to the plurality of detectors and the charged-particle source, the circuitry configured to:
        change an operation mode of the plurality of detectors to switch between a detection mode and a monitoring mode, wherein, in the detection mode, the controller enables the plurality of detectors to accumulate electric charge for a first predetermined time, and in the monitoring mode, the controller enables the plurality of detectors to accumulate electric charge for a second predetermined time that is different from the first predetermined time and to continuously monitor a drift of the primary charged-particle beam incident on the aperture array based on electric charges accumulated by the plurality of detectors, and
        adjust a parameter of the charged-particle source to correct the drift of the primary charged-particle beam based on the electric charges accumulated by the plurality of detectors while the sample is inspected.

2. The apparatus of claim 1, wherein the controller comprises circuitry to measure a current based on the electric charge accumulated by the plurality of detectors.

3. The apparatus of claim 2, wherein the controller comprises circuitry to monitor the current of at least the portion of the primary charged-particle beam.

4. The apparatus of claim 3, wherein the controller comprises circuitry to detect at least one of a change in a position or in a size of at least the portion of the primary charged-particle beam.

5. The apparatus of claim 2, wherein the current of at least the portion of the primary charged-particle beam is used to determine a total current of the primary charged-particle beam.

6. The apparatus of claim 1, wherein the plurality of detectors are configured to detect a change in at least one of a plurality of parameters of the primary charged-particle beam.

7. The apparatus of claim 6, wherein the plurality of parameters comprises at least one of a beam position, a beam diameter, a beam current, a beam current density, or a uniformity of the beam current density.

8. The apparatus of claim 6, wherein each of the plurality of detectors is associated with at least one aperture of the aperture array.

9. The apparatus of claim 6, wherein each of the plurality of detectors is disposed on the aperture array.

10. The apparatus of claim 1, wherein the plurality of detectors comprises a Faraday cup, a diode, an array of diodes, or a scintillator.

11. A method of measuring beam current in a multi-beam apparatus for inspecting a sample, the method comprising:
    generating a primary charged-particle beam by a charged-particle source;
    irradiating the primary charged-particle beam on an aperture array comprising a plurality of detectors disposed on a beam entrance side of the aperture array and along an inside edge of a virtual boundary representing a desired size and position of the primary charged-particle beam incident on the aperture array, the plurality of detectors configured to support a detection mode and a monitoring mode;
    accumulating, using the plurality of detectors, electric charge of at least a portion of the primary charged-particle beam for a first predetermined time during the detection mode and a second predetermined time during the monitoring mode, wherein the first predetermined time is different from the second predetermined time;
    monitoring continuously a drift of the primary charged-particle beam incident on the aperture array based on electric charges accumulated by the plurality of detectors; and
    adjust a parameter of the charged-particle source to correct the drift of the primary charged-particle beam based on the electric charges accumulated by the plurality of detectors while the sample is inspected.

12. The method of claim 11, further comprising measuring a beam current based on the accumulated electric charge.

13. The method of claim 12, further comprising monitoring the beam current of at least the portion of the primary charged-particle beam.

14. The method of claim 11, further comprising detecting change in at least one of a plurality of parameters of the portion of the primary charged-particle beam.

15. The method of claim 11, wherein each of the plurality of detectors is associated with at least one aperture of the aperture array.

16. The apparatus of claim 1, wherein, in the detection mode, the controller comprises circuitry to measure a current density of the primary charged-particle beam based on the electric charge accumulated by the plurality of detectors, the first predetermined time, and area of the plurality of detectors exposed to the primary charged-particle beam.

17. The apparatus of claim 1, wherein, in the detection mode, the plurality of detectors is periodically activated and deactivated for an accumulation of the electric charge.

18. The apparatus of claim 1, wherein, in the monitoring mode, the plurality of detectors is continuously activated to monitor a variation of accumulated electric charge.

* * * * *